(12) United States Patent
Suzuki

(10) Patent No.: US 11,385,276 B2
(45) Date of Patent: Jul. 12, 2022

(54) TEST SYSTEM AND THE METHOD FOR TESTING A SEMICONDUCTOR DEVICE

(71) Applicant: Kioxia Corporation, Tokyo (JP)

(72) Inventor: Kunihiko Suzuki, Machida (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/010,959

(22) Filed: Sep. 3, 2020

(65) Prior Publication Data

US 2021/0255234 A1 Aug. 19, 2021

(30) Foreign Application Priority Data

Feb. 17, 2020 (JP) .............................. JP2020-024007

(51) Int. Cl.
*G01R 31/26* (2020.01)
*G01R 35/00* (2006.01)

(52) U.S. Cl.
CPC ....... *G01R 31/2607* (2013.01); *G01R 35/005* (2013.01)

(58) Field of Classification Search
CPC .......................... G01R 31/2607; G01R 35/005
USPC ................................................... 324/762.01
See application file for complete search history.

(56) References Cited

U.S. PATENT DOCUMENTS

2015/0130474 A1* 5/2015 Nakamura ......... G01N 21/9501
324/501

FOREIGN PATENT DOCUMENTS

| JP | 2002-350507 A | | 12/2002 | |
|---|---|---|---|---|
| JP | 2007-248200 A | | 9/2007 | |
| JP | 2008/089339 | * | 4/2008 | |
| JP | 2008-89339 A | | 4/2008 | |
| JP | 2008089339 | * | 4/2008 | ............. G01R 31/28 |

* cited by examiner

*Primary Examiner* — Farhana A Hoque
(74) *Attorney, Agent, or Firm* — Oblon, McClelland, Maier & Neustadt, L.L.P.

(57) ABSTRACT

A test system includes: an input signal generation unit that generates an input signal that drives a semiconductor device as a test target; a reference signal generation unit that supplies a reference signal, which is for use in generating the input signal, to the input signal generation unit; and a detection unit that, while implementing a test of the semiconductor device, generates a standard signal in which the same signal output as an output of the reference signal output from the reference signal generation unit is expected, and outputs a detection unit output signal based on the reference signal and the standard signal.

8 Claims, 6 Drawing Sheets

FIG. 5

| TEST FUNCTION ITEM | PATTERN GENERATOR | | | ... | POWER SUPPLY INSTRUMENT | | |
|---|---|---|---|---|---|---|---|
| | a1 | a2 | ~ | ... | z1 | z2 | ~ |
| A1 | 1 | 0 | ~ | ... | 0 | 1 | ~ |
| A2 | 0 | 1 | ~ | ... | 1 | 0 | ~ |
| ⋮ | ⋮ | ⋮ | ⋮ | ... | ⋮ | ⋮ | ⋮ |
| FUNCTION DIAGNOSIS ITEM | 1 | 2 | ~ | ... | ~ | N−1 | N |

FIG. 6

| FUNCTION DIAGNOSIS ITEM | DIAGNOSIS INFORMATION |
|---|---|
| 1 | 0 |
| 2 | 0 |
| ⋮ | ⋮ |
| N−1 | 0 |
| N | 0 |

FIG. 7

| FUNCTION DIAGNOSIS ITEM | DIAGNOSIS INFORMATION |
|---|---|
| 1 | 0→1 |
| 2 | 0 |
| ⋮ | ⋮ |
| N−1 | 0→1 |
| N | 0 |

FIG. 8

| FUNCTION DIAGNOSIS ITEM | DIAGNOSIS INFORMATION |
|---|---|
| 1 | 1 |
| 2 | 0 |
| ⋮ | ⋮ |
| N−1 | 1 |
| N | 0 |

TEST SYSTEM AND THE METHOD FOR TESTING A SEMICONDUCTOR DEVICE

CROSS REFERENCE TO RELATED APPLICATIONS

This application is based upon and claims the benefit of priority from prior Japanese Patent Application P2020-024007 filed on Feb. 17, 2020; the entire contents of which are incorporated by reference herein.

FIELD

Embodiments described herein relate generally to a test system for use in a test of a semiconductor device.

BACKGROUND

For a test system for use in a test of a semiconductor device, calibration and function diagnosis are implemented in order to ensure test accuracy and a test function. In the calibration or the function diagnosis, when such a malfunction is detected that a reference signal of a reference frequency, a reference voltage or the like, which is generated inside the test system, is not included in a predetermined range, a test of the semiconductor device may not have been implemented appropriately (hereinafter, this malfunction is referred to as reference signal abnormality). Therefore, when the reference signal abnormality is detected, it is necessary to verify test results of semiconductor devices tested for a period since the previous calibration or function diagnosis is implemented until the reference signal abnormality is detected. A workload for this verification is enormous.

BRIEF DESCRIPTION OF THE DRAWINGS

FIG. 5 is a table illustrating information stored in a diagnosis item storage device.

FIG. 6 is a table illustrating examples of diagnosis information of function diagnosis items.

FIG. 7 is a table illustrating examples of rewriting diagnosis information.

FIG. 8 is a table illustrating examples of the diagnosis information while function diagnosis is implemented.

DETAILED DESCRIPTION

Figure 1:
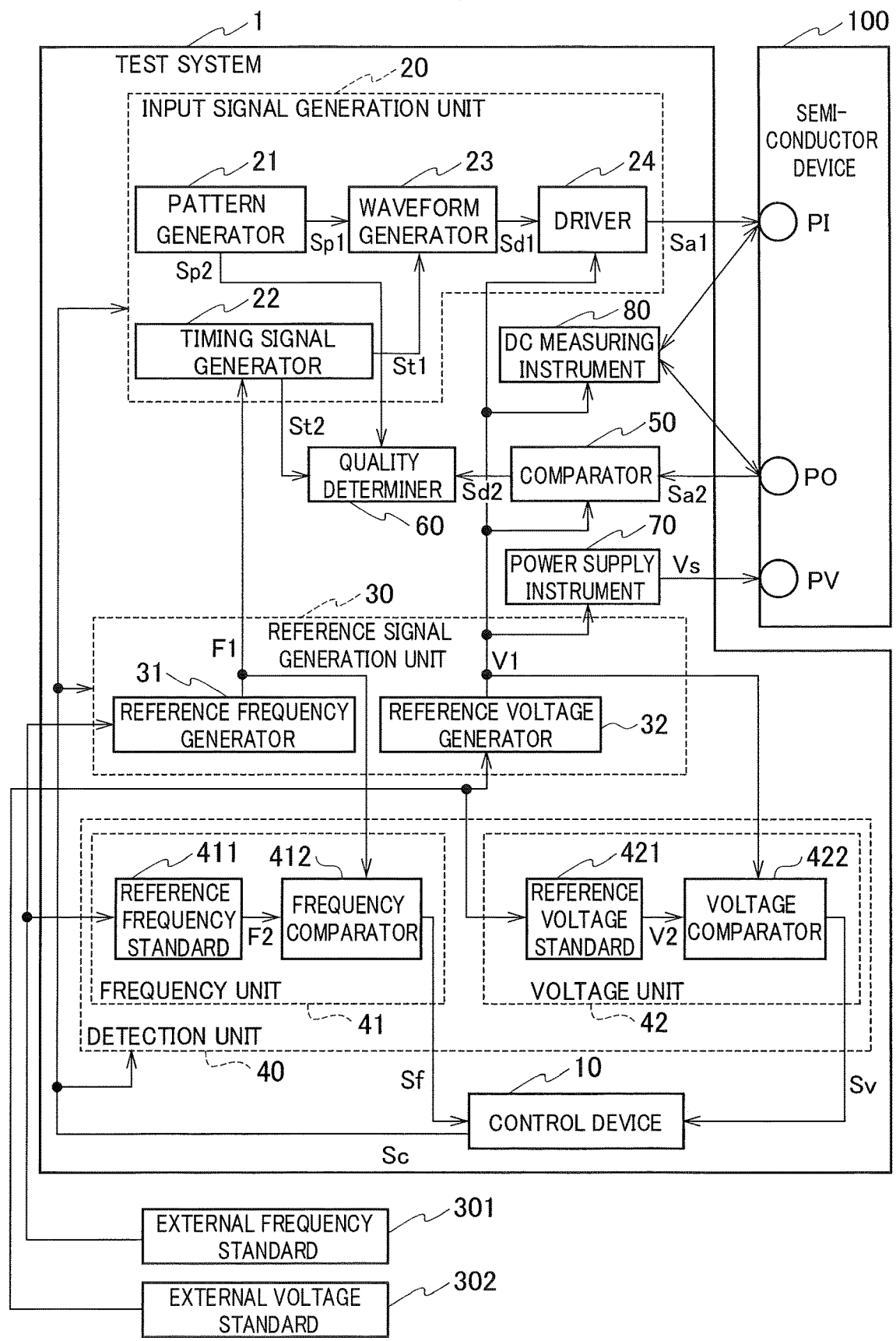
FIG. 1 is a schematic diagram illustrating a configuration of a test system according to a first embodiment.

A test system according to embodiments includes: an input signal generation unit that generates an input signal that drives a semiconductor device as a test target; a reference signal generation unit that supplies a reference signal, which is for use in generating the input signal, to the input signal generation unit; and a detection unit that, while implementing a test of the semiconductor device, generates a standard signal in which the same signal output as an output of the reference signal output from the reference signal generation unit is expected, and outputs a detection unit output signal based on the reference signal and the standard signal.

Hereinafter, a description will be given of embodiments with reference to the drawings. In the description of the drawings, the same reference numerals are assigned to the same portions, and a description thereof is omitted.

First Embodiment

A test system 1 according to a first embodiment, which is illustrated in FIG. 1, is used for a test of a semiconductor device 100. As illustrated in FIG. 1, the test system 1 includes a control device 10, an input signal generation unit 20, a reference signal generation unit 30, a detection unit 40, a comparator 50, and a quality determiner 60.

The control device 10 executes a test program prepared for testing the semiconductor device 100, and controls the whole operation of the test system 1. Moreover, the control device 10 controls functional blocks, which constitute the test system 1, based on a function diagnosis program, and executes function diagnosis of the test system 1. In the function diagnosis, it is diagnosed whether or not the functional blocks which constitute the test system 1 operate as specified. The control device 10 controls the functional blocks, which constitute the test system 1, by a control signal Sc output from the control device 10 to the functional block.

The input signal generation unit 20 generates an input signal that drives the semiconductor device 100, which is a test target, by the control of the control device 10. The input signal generation unit 20 includes a pattern generator 21, a timing signal generator 22, a waveform generator 23, and a driver 24 as the functional blocks.

The pattern generator 21 generates an input pattern signal Sp1 set so as to drive the semiconductor device 100. The timing signal generator 22 generates an input timing signal St1 that sets timing when the input signal generation unit 20 outputs an input signal to the semiconductor device 100. The waveform generator 23 generates an input digital signal Sd1 in response to the input pattern signal Sp1 and the input timing signal St1. That is, the waveform generator 23 generates an input digital signal Sd1 that changes in response to the input pattern signal Sp1 at timing set in the input timing signal St1.

The input digital signal Sd1 generated by the waveform generator 23 is output to the driver 24. The driver 24 converts the input digital signal Sd1 into an input analog signal Sa1 having an amplitude based on test conditions. The driver 24 supplies the input analog signal Sa1 as an input signal, which drives the semiconductor device 100, to an input terminal PI of the semiconductor device 100.

The reference signal generation unit 30 supplies a reference signal, which is for use in generating input signals supplied to the semiconductor device 100, to the input signal generation unit 20. The reference signal generation unit 30 includes a reference frequency generator 31 and a reference voltage generator 32 as the functional blocks.

The reference frequency generator 31 supplies a reference frequency F1 as a reference signal to the timing signal generator 22. The timing signal generator 22 generates the input timing signal St1 with the reference frequency F1 taken as a reference. Note that the reference frequency generator 31 is calibrated by an external frequency standard 301.

The reference voltage generator 32 supplies a reference voltage V1 as a reference signal to the input signal generation unit 20. A voltage reference of the driver 24 is set with the reference voltage V1 taken as a reference. Note that the reference voltage generator 32 is calibrated by an external voltage standard 302.

While implementing the test of the semiconductor device 100, the detection unit 40 generates a standard signal from which the same signal outputs as those of the reference signals output from the reference signal generation unit 30 are expected. Then, the detection unit outputs detection unit output signals based on the reference signals and the standard signals. For example, the detection unit 40 generates the standard signals according to the same specifications as those of the reference signal generation unit 30, and outputs, as the detection unit output signals, comparison results between the reference signals and the standard signals. The detection unit 40 illustrated in FIG. 1 includes a frequency unit 41 and a voltage unit 42 as the functional blocks.

The frequency unit 41 includes a reference frequency standard 411 capable of generating a standard frequency having the same phase as that of the reference frequency, and a frequency comparator 412. The reference frequency standard 411 has the same specifications as those of the reference frequency generator 31, and generates a standard frequency F2 as the standard signal.

Here, for example, for each of the reference frequency generator 31 and the reference frequency standard 411, "specifications" mean signal characteristics such as timing when an output signal is output for an input signal and a level of the output signal. "The same specifications" refer to the fact that, between the reference frequency generator 31 and the reference frequency standard 411, main specifications are common under normal operating conditions, and a correspondence relationship between the input signal and the output signal completely coincide, or substantially coincide.

The reference frequency standard 411 is calibrated by the external frequency standard 301 for use in calibrating the reference frequency generator 31, For example, the reference frequency generator 31 and the reference frequency standard 411 are devices having the same configuration. "The same configuration" refers to the fact that, between the reference frequency generator and the reference frequency standard 411, main components and a connection relationship between the components are the same or substantially coincide.

The reference frequency F1 generated by the reference frequency generator 31 and the standard frequency F2 generated by the reference frequency standard 411 are input to the frequency comparator 412. The frequency comparator 412 compares phases of the reference frequency F1 and the standard frequency F2 with each other. For example, the frequency comparator 412 calculates a phase difference (hereinafter, referred to as "comparative phase difference") between the reference frequency F1 and the standard frequency F2. Then, the frequency comparator 412 outputs a signal, which corresponds to the comparative phase difference, to the control device 10. For example, the frequency comparator 412 outputs a frequency comparison signal Sf, which has a voltage value proportional to the comparative phase difference, as a detection unit output signal to the control device 10.

The reference frequency generator 31 and the reference frequency standard 411 have the same specifications, and are calibrated by the same external frequency standard 301. Therefore, if there is no reference signal abnormality in the test system 1, the phases of the reference frequency F1 and the standard frequency F2 substantially coincide with each other. Hence, when the comparative phase difference exceeds a predetermined set value, the control device 10 determines that the test accuracy may not be able to be ensured. While including a certain tolerance, the set value for the comparative phase difference is set in a range where the test of the semiconductor device 100 can be implemented normally.

The voltage unit 42 includes a reference voltage standard 421 capable of generating a standard voltage that is the same as the reference voltage, and a voltage comparator 422. The reference voltage standard 421 has the same specifications as those of the reference voltage generator 32, and generates a standard voltage V2 as the standard signal. The reference voltage standard 421 is calibrated by the external voltage standard 302 for use in calibrating the reference voltage generator 32, For example, the reference voltage generator 32 and the reference voltage standard 421 are devices having the same configuration.

The reference voltage V1 generated by the reference voltage generator 32 and the standard voltage V2 generated by the reference voltage standard 421 are input to the voltage comparator 422. The voltage comparator 422 compares the reference voltage V1 and the standard voltage V2 with each other. For example, the voltage comparator 422 calculates a voltage difference (hereinafter, referred to as "comparative voltage difference") between the reference voltage V1 and the standard voltage V2. Then, the voltage comparator 422 outputs a voltage comparison signal Sv, which corresponds to the comparative voltage difference, as a detection unit output signal to the control device 10.

The reference voltage generator 32 and the reference voltage standard 421 have the same specifications, and are calibrated by the same external voltage standard 302. Therefore, if there is no reference signal abnormality in the test system 1, the reference voltage V1 and the standard voltage V2 substantially coincide with each other. Hence, when the comparative voltage difference exceeds a predetermined set value, the control device 10 determines that the test accuracy may not be able to be ensured. While including a certain tolerance, the set value for the comparative voltage difference is set in a range where the test of the semiconductor device 100 can be implemented normally.

A quality determination of the semiconductor device 100 by the test system 1 is implemented as follows.

By the control of the control device 10, the comparator 50 receives an output signal output from the semiconductor device 100. Then, the comparator 50 compares the output signal with voltage reference based on the test conditions, and converts the output signal into an output digital signal Sd2 on which the output signal is reflected.

For example, the comparator 50 receives an output analog signal Sa2 output from an output terminal PO of the semiconductor device 100. Then, the comparator 50 converts the output analog signal Sa2 into the output digital signal Sd2, and outputs the output digital signal Sd2 to the quality determiner 60. The voltage reference of the comparator 50 is set with the reference voltage V1, which is supplied by the reference voltage generator 32, taken as a reference.

By the control of the control device 10, the quality determiner 60 determines quality of the semiconductor device 100 based on the output signal output from the semiconductor device 100. The quality determination by the quality determiner 60 is performed by using an expected value pattern signal Sp2 generated by the pattern generator 21 and a comparison timing signal St2 generated by the timing signal generator 22.

That is, the quality determiner 60 compares the output digital signal Sd2 and the expected value pattern signal Sp2 with each other at timing set by the comparison timing signal St2. At this time, if the output digital signal Sd2 and the expected value pattern signal Sp2 coincide with each other, then the quality determiner 60 determines that the semiconductor device 100 is acceptable. Meanwhile, if the output digital signal Sd2 and the expected value pattern signal Sp2 do not coincide with each other, then the quality determiner 60 determines that the semiconductor device 100 is a defective product.

Note that a predetermined power supply voltage Vs is applied from a power supply instrument 70 of the test system 1 to a power supply terminal PV of the semiconductor device 100 under test, and a power supply current is supplied to the semiconductor device 100. Moreover, a DC measuring instrument 80 measures voltage values and current values of the input terminal PI and output terminal PO of the semiconductor device 100. A voltage reference of each of the power supply instrument and the DC measuring instrument 80 is set with the reference voltage V1, which is supplied by the reference voltage generator 32, taken as a reference.

For the test system 1, the calibration and the function diagnosis are implemented in order to ensure the test accuracy and the test function. Hereinafter, the calibration and the function diagnosis in the test system 1 will be described.

The calibration of the test system 1 is performed by comparing the reference frequency generator 31 and the reference voltage generator 32 with such external standards which trace national standards. By this calibration, it is confirmed that the reference frequency F1 and the reference voltage V1 remain within error ranges each of which is necessary to ensure predetermined test accuracy. Note that, though FIG. 1 illustrates a state in which the external frequency standard 301 and the external voltage standard 302 as external standards are connected to the test system 1, the external standards are connected to the test system 1 only at the time of calibration in general.

In the calibration, when the error ranges of the reference frequency F1 and the reference voltage V1 do not remain within ranges each of which ensures the test accuracy, it is necessary to go back to a period while there has been implemented calibration in which the error ranges each of which ensures the test accuracy have been obtained, and to verify test results of the semiconductor device 100. Since the external standards are required in the calibration, a time interval of implementing the calibration is generally set long. For example, the time interval of implementing the calibration is approximately one year. Therefore, for example, test results of the semiconductor device 100 during one year from the previous calibration until the present calibration is verified. Hence, when the reference signal abnormality is detected by the calibration, a workload required for the verification is enormous.

In the function diagnosis, by executing the function diagnosis program, the control device 10 confirms whether or not each of the functions of the test system 1 operates as specified. When it is proven that there is a function that does not satisfy the specifications, it is necessary to go back to a period while the previous function diagnosis has been implemented, and to verify the test results of the semiconductor device 100.

Since the function diagnosis can be implemented by only the test system 1, such a time interval of implementing the function diagnosis is generally set shorter in comparison with the calibration that requires the external standards. For example, the time interval of implementing the function diagnosis is approximately one week. Note that, in order to confirm the overall functions of the test system 1, the time required for the function diagnosis tends to be longer than the time required for the calibration.

In contrast, in the test system 1, the reference signal abnormality can be detected during the test of the semiconductor device 100. Hereinafter, referring to FIG. 2, a test method of the semiconductor device 100 by the test system 1 will be described.

Figure 2:
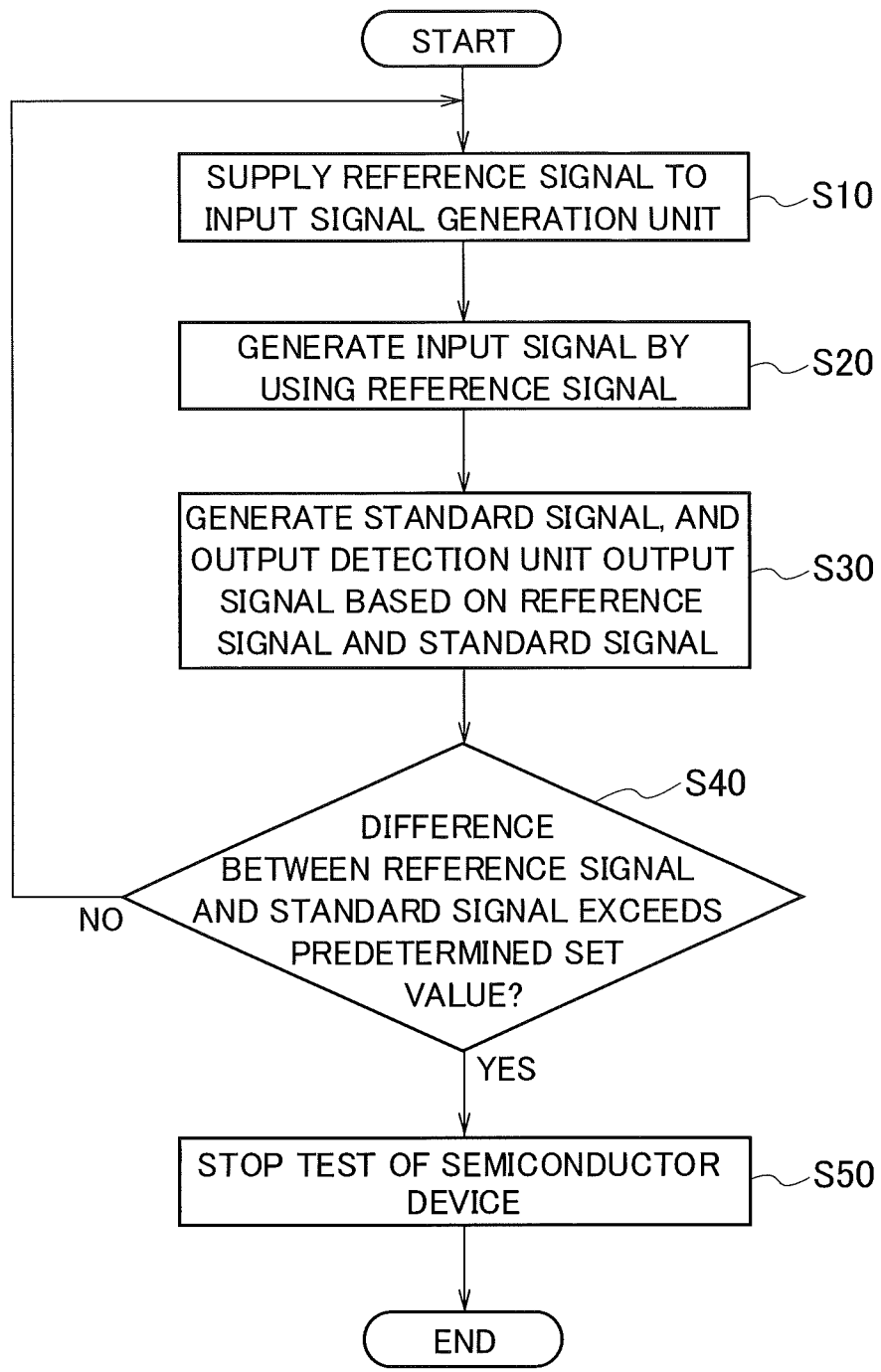
FIG. 2 is a flowchart for explaining a test method by the test system according to the first embodiment.

In Step S10 of FIG. 2, in the reference signal generation unit 30, the reference signal is supplied to the input signal generation unit 20. In Step S20, in the input signal generation unit 20, the input signal that drives the semiconductor device 100 is generated by using the reference signal.

In Step S30, while implementing the test of the semiconductor device 100, the standard signal from which the same signal outputs as those of the reference signals output from the reference signal generation unit 30 are expected is generated in the detection unit 40. Then, the detection unit output signals based on the reference signals and the standard signals are output in the detection unit 40. That is, the test system 1 generates the standard frequency F2 compared with the reference frequency F1, and the standard voltage V2 compared with the reference voltage V1. Then, during the test of the semiconductor device 100, the test system 1 always confirms the comparative phase difference between the reference frequency F1 and the standard frequency F2 and the comparative voltage difference between the reference voltage V1 and the standard voltage V2. The detection unit 40 outputs the detection unit output signals in response to the results of comparing the reference signals and the standard signals with each other.

In Step S40, based on the detection unit output signals, the control device 10 determines whether or not the differences between the reference signals and the standard signals exceed the predetermined set values. When the differences between the reference signals and the standard signals exceed the predetermined set values, the processing proceeds to Step S50. When the differences between the reference signals and the standard signals satisfy the predetermined set values, the processing returns to Step S10, where the test of the semiconductor device 100 is continued.

In Step S50, in the control device 10, the test of the semiconductor device 100 is stopped based on the detection unit output signals output from the detection unit 40. That is, by the control of the control device 10, the test system 1 stops the test of the semiconductor device 100 when the comparative phase difference exceeds the predetermined set value and when the comparative voltage difference exceeds the predetermined set value.

As described above, according to the test system 1, a malfunction of the reference signals of the reference frequency F1, the reference voltage V1 and the like can be detected while implementing the test of the semiconductor device 100. Therefore, by stopping the test, an inaccurate test can be suppressed from being implemented in a state in which the malfunction occurs in the reference signals.

Hence, according to the test system 1, the verification of the test results when the reference signal abnormality in the calibration and the function diagnosis is detected can be suppressed from being implemented. That is, the verification of the test results, which is caused by the occurrence of the malfunction of the reference signals, can be reduced. That is, according to the test system 1, verification work for going back to an implementation period of the previous calibration and function diagnosis can be avoided, and a workload of the verification work can be reduced.

When detected, the reference signal abnormality is confirmed by the calibration using the external standards in order to determine whether or not each of the reference signals deviates from the test accuracy that satisfies the device specifications. If there is a problem in the calibration of the reference signals, the calibration of the reference signal generation unit 30 is redone, and the test is started again for the semiconductor device 100 for which the test is stopped. If there is no problem in the calibration of the reference signal, the test of the semiconductor device 100 is resumed. At this time, when the abnormality is detected again, the test system 1 may have a trouble, and inspection, repair and the like of the test system 1 are studied.

Incidentally, in the test system 1, in order to accurately compare the phases of the reference frequency F1 and the standard frequency F2 with each other, it is necessary to cause the references of the phases of the reference frequency F1 and the standard frequency F2 to coincide with each other. For example, in such a way as below, the references of the phases of the reference frequency F1 and the standard frequency F2 are caused to coincide with each other before the test of the semiconductor device 100 is started.

In the test system 1, the reference frequency generator 31 and the reference frequency standard 411 are controlled by the control signals output from the control device 10. Therefore, adjusted can be timing when the control signal output from the control device 10 is input to the reference frequency generator 31 and timing when the control signal output from the control device 10 is input to the reference frequency standard 411. Thus, the references of the phases of the reference frequency F1 and the standard frequency F2 can be caused to coincide with each other.

Figure 3:
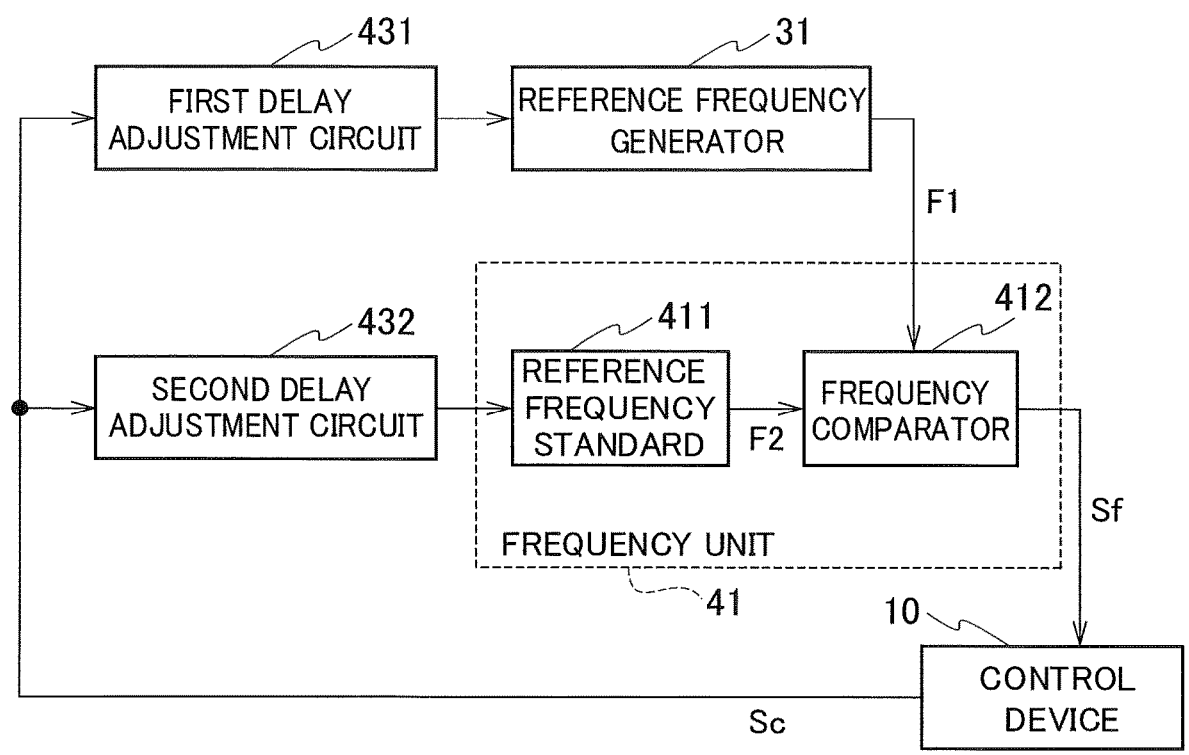
FIG. 3 is a schematic view illustrating an example of a circuit that detects a comparative phase difference.

For example, as illustrated in FIG. 3, a first delay adjustment circuit 431 is disposed on a signal line in which the control signal Sc propagates between the control device 10 and the reference frequency generator 31. Moreover, a second delay adjustment circuit 432 is disposed in a signal line in which the control signal Sc propagates between the control device 10 and the reference frequency standard 411. A signal delay time in each of the first delay adjustment circuit 431 and the second delay adjustment circuit 432 is adjusted, whereby the references of the phases of the reference frequency F1 and the standard frequency F2 can be caused to coincide with each other. For example, programmable delay lines and the like are used for the first delay adjustment circuit 431 and the second delay adjustment circuit 432.

Moreover, in order to appropriately implement the comparison between the reference signals generated by the reference signal generation unit 30 and the standard signals generated by the detection unit 40, it is preferable that an ambient environment such as a temperature be equivalent to those of the reference signal generation unit 30 and the detection unit 40. Therefore, for example, the reference frequency generator 31 and the reference frequency standard 411 are disposed adjacent to each other, and the reference voltage generator 32 and the reference voltage standard 421 are disposed adjacent to each other. Here, "disposed adjacent to each other" refers to that two components are disposed at positions of coming in contact with each other, or are disposed close to each other to an extent of not being affected by other components.

Note that, in the above, the illustrative description is given of the case where both of the reference frequency F1 and the reference voltage V1 are compared with the standard signals generated by the detection unit 40 to detect the reference signal abnormality. However, either one of the reference frequency F1 and the reference voltage V1 may be compared with the standard signal to detect the reference signal abnormality. Alternatively, other reference signals than those of the reference frequency F1 and the reference voltage V1, the other reference signals being used in the test system 1, may be compared with the standard signals to detect the reference signal abnormality.

Second Embodiment

Figure 4:
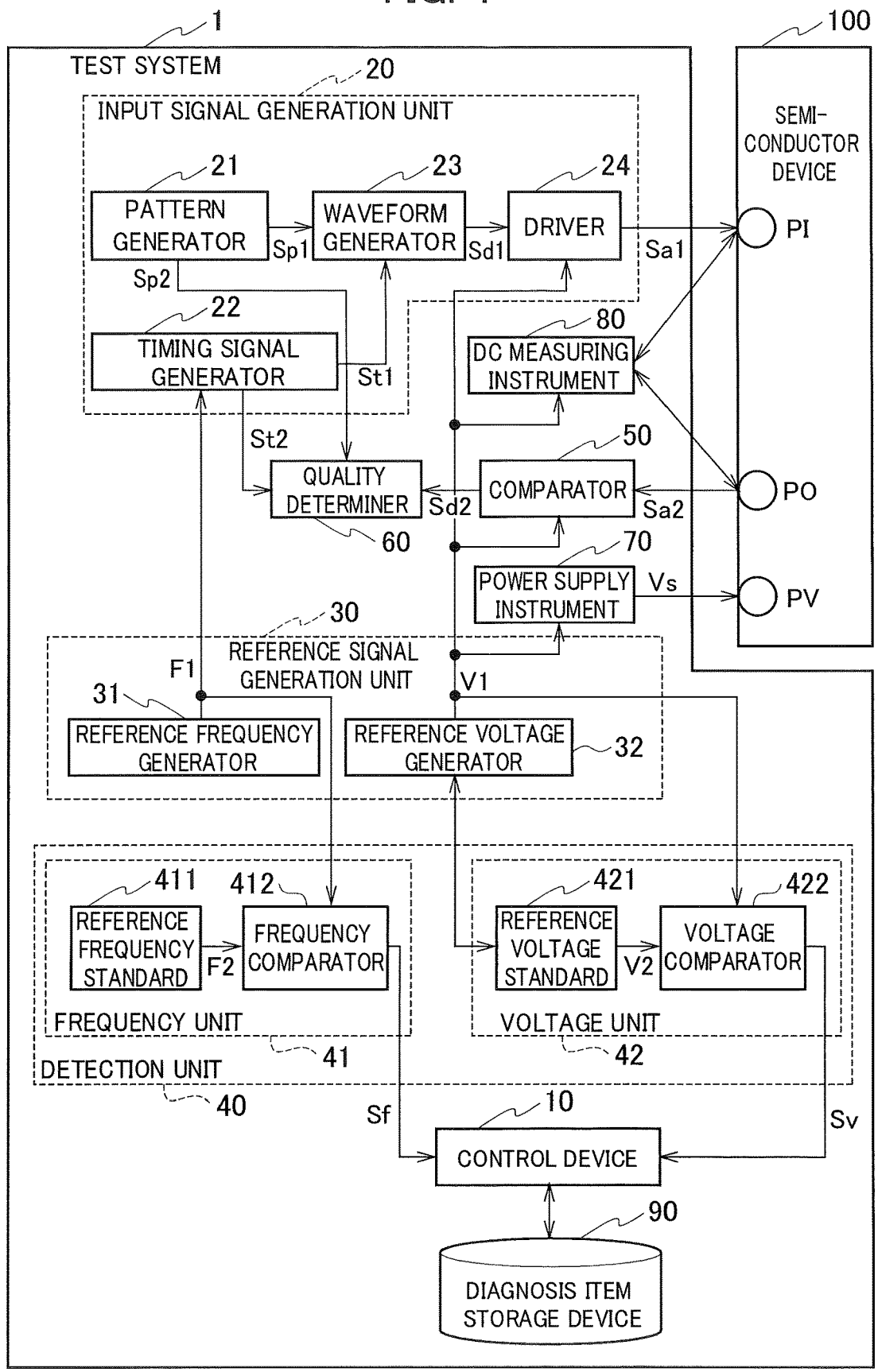
FIG. 4 is a schematic diagram illustrating a configuration of a test system according to a second embodiment.

As illustrated in FIG. 4, a test system 1 according to a second embodiment of the present invention includes a diagnosis item storage device 90. Regarding function diagnosis for diagnosing whether or not each function of the test system 1 operates as specified, the diagnosis item storage device 90 stores information in which whether or not to implement the function diagnosis is set for each of function diagnosis items (hereinafter, this information will be referred to as "diagnosis information"). The test system 1 illustrated in FIG. 4 is different from that in FIG. 1 in further including the diagnosis item storage device 90. Other configurations of the test system 1 according to the second embodiment are the same as those according to the first embodiment, which are illustrated in FIG. 1.

Each of items of the functions serving as test targets of the semiconductor device 100 is implemented by using a plurality of functional blocks, which are provided in the test system 1, alone or in plurality (hereinafter, these items will be referred to as "test function items"). FIG. 5 illustrates examples of relationships between the test function items of the semiconductor device 100 and functions of the functional blocks of the test system 1, which are used in the respective test function items.

As illustrated in FIG. 5, generally, one functional block has a plurality of functions. For example, the pattern generator 21 has a plurality of functions to individually generate input pattern signals, which are different in frequency from one another, in response to a plurality of signals propagated in the semiconductor device 100. In FIG. 5, the functions of the pattern generator 21 are indicated as functions a1, a2 . . . . Moreover, the power supply instrument 70 has plurality of functions to supply voltages different from one another in rise time, peak voltage and the like. In FIG. 5, the functions of the power supply instrument 70 are indicated as functions z1, z2 . . . .

In FIG. 5, functions for use in implementing the respective test function items are indicated as "1", and functions not for use in implementing the same are indicated as "0". For example, the test function item A1 is implemented by using a function a1 of the pattern generator 21 and a function z2 of the power supply instrument 70.

Moreover, FIG. 5 also illustrates correspondences between the functions of the functional blocks of the test system 1 and the function diagnosis items. The function diagnosis items corresponding to the respective functions of the functional blocks are implemented, whereby it is confirmed whether or not these functions operate as specified. For example, the function a1 of the pattern generator 21 is confirmed by implementing the function diagnosis item "1". The function diagnosis program for executing the function diagnosis of the test system 1 is set so as to implement a plurality of the function diagnosis items in response to the test function items implemented by the test system 1. FIG. 5 illustrates a case where the number of the function diagnosis items is N. Note that there is also a case where one function of the functional blocks is confirmed by implementing the plurality of function diagnosis items.

The diagnosis item storage device 90 stores the information illustrated in FIG. 5. Moreover, the diagnosis item storage device 90 stores diagnosis information of function diagnosis items, for example, as illustrated in FIG. 6. Here, diagnosis information of function diagnosis items which are not subjected to the function diagnosis is "0", and diagnosis information of function diagnosis items which are subjected to the function diagnosis is "1". Moreover, hereinafter, each of the function diagnosis items which are subjected to the function diagnosis will be referred to as "function diagnosis target item".

As details will be described later, in the function diagnosis of the test system 1, the control device 10 performs reading and writing of the diagnosis information stored in the diagnosis item storage device 90. Hereinafter, operations of the test system 1 including the diagnosis item storage device 90 will be described.

Before the test of the semiconductor device 100 is started, the diagnosis information is initialized for all of the function diagnosis items, which are stored in the diagnosis item storage device 90, by the control of the control device 10. The initialization is executed, for example, by setting the diagnosis information to "0" (initial state). FIG. 6 illustrates the initialized diagnosis information of the function diagnosis items.

Before the test of the semiconductor device 100 is started, the control device 10 executes or analyzes a test program applied to the test of the semiconductor device 100, thereby extracting a function diagnosis item for a function for use in the test of the semiconductor device 100. For example, the control device 10 refers to the information stored in the diagnosis item storage device 90, and extracts, as a function diagnosis target item, the function diagnosis item for the function for use in the test of the semiconductor device 100.

The control device 10 rewrites the diagnosis information of the extracted function diagnosis target item to "1". FIG. 7 illustrates an example of rewriting the diagnosis information of the function diagnosis item from "0" to "1" before the test is started. In the example illustrated in FIG. 7, pieces of the diagnosis information of the function diagnosis item "1" and the function diagnosis item "N−1" for the functions for use in the test function item A1 are rewritten to "1".

The control device 10 refers to the information stored in the diagnosis item storage device 90, and implements the function diagnosis for only the function diagnosis target item. That is, when implementing the function diagnosis of the test system 1, the control device 10 implements the function diagnosis for only the function diagnosis item in which the diagnosis information of the diagnosis item storage device 90 is "1". While the control device 10 is implementing the function diagnosis, the diagnosis information of the diagnosis item storage device 90 is in a state illustrated in FIG. 8. Then, after implementing the function diagnosis, the control device 10 rewrites, to "0", the diagnosis information of the function diagnosis items subjected to the function diagnosis. Thus, the pieces of diagnosis information of the diagnosis item storage device 90 after the function diagnosis is implemented returns to the state illustrated in FIG. 6.

As described above, after initializing the diagnosis information of the function diagnosis items, the control device 10 extracts, as the function diagnosis target items, only the function diagnosis items for the functions of the functional blocks, which are for use in the test of the semiconductor device 100. The function diagnosis is implemented for only the function diagnosis target items, whereby a time required to implement the function diagnosis can be shortened. Moreover, a period of interrupting the test of the semiconductor device 100 in order to implement the function diagnosis is shortened, and accordingly, a time interval of implementing the function test can also be set short. As a result, when the abnormality of the function of the functional block is detected, such a period while the test results must be verified by going back to the point of time of the normality can be shortened.

The function diagnosis for the function diagnosis target items may be implemented before the test of the semiconductor device 100 is started, or may be implemented after the test of the semiconductor device 100 is completed. The function diagnosis is implemented before the test of the semiconductor device 100 is started, whereby, when the function is abnormal, it is possible to repair or adjust the functional block before the test is started. Moreover, the function diagnosis is implemented after the test of the semiconductor device 100 is completed, whereby it can be ensured that test is implemented normally.

Note that one test function item sometimes corresponds to a plurality of the function diagnosis items. Therefore, the diagnosis item storage device 90 is configured to be capable of simultaneously rewriting the diagnosis information of the plurality of function diagnosis items.

In the above, the description is given of the case of extracting the function diagnosis target items before the test of the semiconductor device 100 is started. Meanwhile, as will be described later, the function diagnosis target items may be extracted while implementing the test of the semiconductor device 100.

In that case, before the test of the semiconductor device 100 is started, the control device 10 initializes the diagnosis information of the function diagnosis items of the diagnosis item storage device 90. That is, as illustrated in FIG. 6, the control device 10 sets all pieces of the diagnosis information of the function diagnosis items to "0" (initial state) before the test is started. Thereafter, the test of the semiconductor device 100 starts.

During the test of the semiconductor device 100, every time when the function of the test system 1 is used, the control device 10 extracts the function diagnosis item for that function as the function diagnosis target item, and rewrites, to "1", the diagnosis information of the extracted function diagnosis target item. For example, as illustrated in FIG. 7, the control device 10 rewrites, to "1", the diagnosis information of the function diagnosis item "1" and the function diagnosis item "N−1" for the test function item A1.

Then, after the test of the semiconductor device 100 is completed, the control device 10 performs the function diagnosis of the test system 1. At this time, the control device 10 refers to the information in the diagnosis item storage device 90, and implements the function diagnosis for only the function diagnosis target item in which the diagnosis information is "1". While the control device 10 is implementing the function diagnosis, the diagnosis information of the diagnosis item storage device 90 is, for example, in the state illustrated in FIG. 8. After implementing the function diagnosis, the control device rewrites, to "0", the diagnosis information of the function diagnosis target items subjected to the function diagnosis.

As described above, the function diagnosis target items can be extracted while implementing the test of the semiconductor device 100, and the function diagnosis for the functions used for the test of the semiconductor device 100 can be implemented after the test. Thus, when the functions used for the test are not abnormal, it can be ensured that the test is implemented normally.

While certain embodiments have been described, these embodiments have been presented by way of example only, and are not intended to limit the scope of the inventions. Indeed, the novel embodiments described herein may be embodied in a variety of other forms: furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

(Supplementary Notes)

(Supplementary Note 1)

A test system including: an input signal generation unit that generates an input signal that drives a semiconductor device as a test target;

a reference signal generation unit that supplies a reference signal, which is for use in generating the input signal, to the input signal generation unit;

a detection unit that, while implementing a test of the semiconductor device, generates a standard signal according to the same specifications as those of the reference signal generation unit, and outputs a comparison result between the reference signal and the standard signal; and a control device that stops the test of the semiconductor device in response to the comparison result.

(Supplementary Note 2)

The test system according to Supplementary note 1, wherein the reference signal generation unit includes a reference frequency generator that supplies a reference frequency to the input signal generation unit, and wherein the detection unit includes:

a reference frequency standard that has the same specifications as specifications of the reference frequency generator, and generates a standard frequency; and a frequency comparator that outputs a frequency comparison signal as the comparison result to the control device, the frequency comparison signal corresponding to a phase difference between the reference frequency and the standard frequency.

(Supplementary Note 3)

The test system according to Supplementary note 2, wherein, while implementing the test of the semiconductor device, the frequency comparator confirms a phase difference between the reference frequency and the standard frequency, and wherein the control device stops the test of the semiconductor device when the phase difference exceeds a set value.

(Supplementary Note 4)

The test system according to Supplementary note 3, wherein the frequency comparator transmits a frequency comparison signal of a voltage value, which is proportional to the phase difference, as the comparison result to the control device.

(Supplementary Note 5)

The test system according to Supplementary note 2, wherein the reference frequency generator and the reference frequency standard are devices having the same configuration.

(Supplementary Note 6)

The test system according to Supplementary note 2, wherein the input signal generation unit includes a timing signal generator that generates, with the reference frequency taken as a reference, an input timing signal when the input signal generation unit transmits the input signal to the semiconductor device.

(Supplementary Note 7)

The test system according to Supplementary note 1, wherein the reference signal generation unit includes a reference voltage generator that supplies a reference voltage to the input signal generation unit, and wherein the detection unit includes:

a reference voltage standard that has the same specifications as specifications of the reference voltage generator, and generates a standard voltage; and a voltage comparator that outputs a voltage comparison signal as the comparison result to the control device, the comparison signal corresponding to a voltage difference between the reference voltage and the standard voltage.

(Supplementary Note 8)

The test system according to Supplementary note 7, wherein the reference voltage generator and the reference voltage standard are devices having the same configuration.

(Supplementary Note 9)

The test system according to Supplementary note 7, further comprising a power supply instrument that applies a power supply voltage to a power supply terminal of the semiconductor device, wherein a voltage reference of the power supply instrument is set with the reference voltage taken as a reference.

(Supplementary Note 10)

A test system comprising:

an input signal generation unit that generates an input signal that drives a semiconductor device as a test target;

a reference frequency generator that supplies a reference frequency to the input signal generation unit;

a reference frequency standard capable of generating a standard frequency having the same phase as a phase of the reference frequency while implementing a test of the semiconductor device;

a frequency comparator that outputs a frequency comparison signal corresponding to a phase difference between the reference frequency and the standard frequency; and a control device that stops the test of the semiconductor device based on the frequency comparison signal.

(Supplementary Note 11)

The test system according to Supplementary note 10, further comprising:

a reference voltage generator that supplies a reference voltage to the input signal generation unit;

a reference voltage standard capable of generating a standard voltage that is the same as the reference voltage; and a voltage comparator that outputs a voltage comparison signal corresponding to a voltage difference between the reference voltage and the standard voltage.

(Supplementary Note 12)

The test system according to Supplementary note 11, wherein the control device stops the test of the semiconductor device based on the voltage comparison signal.

(Supplementary Note 13)

The test system according to Supplementary note 11, further comprising:

a comparator that receives an output signal output from the semiconductor device; and a quality determiner that determines quality of the semiconductor device based on the output signal, wherein a voltage reference of the comparator is set with the reference voltage taken as a reference.

(Supplementary Note 14)

A test system comprising:

an input signal generation unit that generates an input signal that drives a semiconductor device as a test target;

a reference frequency generator that supplies a reference frequency to the input signal generation unit;

a reference frequency standard capable of generating a standard frequency having the same phase as a phase of the reference frequency while implementing a test of the semiconductor device;

a frequency comparator that outputs a frequency comparison signal corresponding to a phase difference between the reference frequency and the standard frequency;

a control device that stops the test of the semiconductor device based on the frequency comparison signal; and a diagnosis item storage device that, regarding function diagnosis for diagnosing whether or not each function of the test system operates as specified, stores information in which whether or not to implement the function diagnosis is set for each of function diagnosis items, wherein the control device extracts the function diagnosis item for a function for use in the test of the semiconductor device as a function diagnosis target item subjected to the function diagnosis, and wherein the control device refers to the information stored in the diagnosis item storage device, and implements the function diagnosis for only the function diagnosis target item.

(Supplementary Note 15)

The test system according to Supplementary note 14, wherein the control device extracts the function diagnosis target item before the test of the semiconductor device is started.

What is claimed is:

1. A test system comprising:

an input signal generation unit that generates an input signal that drives a semiconductor device as a test target;

a reference signal generation unit that supplies a reference signal to the input signal generation unit, the reference signal for use as a reference in an operation in which the input signal generation unit generates the input signal, to the input signal generation unit; and a detection unit that, while implementing a test of the semiconductor device, generates a standard signal in which the same signal output as an output of the reference signal output from the reference signal generation unit is expected, and outputs a detection unit output signal based on the reference signal and the standard signal, wherein the reference signal generation unit includes a reference frequency generator that supplies a reference frequency to the input signal generation unit, and wherein the election unit includes:

a reference frequency standard capable of generating a standard frequency having the same phase as a phase of the reference frequency; and a frequency comparator that outputs a frequency comparison signal corresponding to a phase difference between the reference frequency and the standard frequency.

2. The test system according to claim 1, wherein the detection unit outputs the detection unit output signal in response to a result of comparing the reference frequency and the standard frequency with each other, wherein the test system further includes a control device that stops the test of the semiconductor device based on the detection unit output signal output from the detection unit, and wherein the test system further includes:

a first delay adjustment circuit disposed on a signal line in which a control signal output from the control device to the reference frequency generator propagates; and a second delay adjustment circuit disposed on a signal line in which a control signal output from the control device to the reference frequency standard propagates.

3. The test system according to claim 2, wherein the first delay adjustment circuit and the second delay adjustment circuit are programmable delay lines.

4. The test system according to claim 1, wherein the reference frequency generator and the reference frequency standard are disposed adjacent to each other.

5. A test system comprising:

an input signal generation unit that generates an input signal that drives a semiconductor device as a test target;

a reference signal generation unit that supplies a reference signal to the input signal generation unit, the reference signal for use as a reference in an operation in which the input signal generation unit generates the input signal, to the input signal generation unit; and a detection unit that, while implementing a test of the semiconductor device, generates a standard signal in which the same signal output as an output of the reference signal output from the reference signal generation unit is expected, and outputs a detection unit output signal based on the reference signal and the standard signal, wherein the detection unit outputs the detection unit output signal in response to a result of comparing the reference signal and the standard signal with each other, wherein the test system further includes a control device that stops the test of the semiconductor device based on the detection unit output signal output from the detection unit, wherein the test system further includes a diagnosis item storage device that, regarding function diagnosis for diagnosing whether or not each function of the test system operates as specified, stores information in which whether or not to implement the function diagnosis is set for each of function diagnosis items, wherein the control device extracts the function diagnosis item for a function for use in the test of the semiconductor device as a function diagnosis target item subjected to the function diagnosis, wherein the control device refers to the information stored in the diagnosis item storage device, and implements the function diagnosis for only the function diagnosis target item, and wherein the control device extracts the function diagnosis target item before the test of the semiconductor device is started.

6. The test system according to claim 5, wherein the control device analyzes a test program applied to the test of the semiconductor device and extracts the function diagnosis target item.

7. A test system comprising:

an input signal generation unit that generates an input signal that drives a semiconductor device as a test target;

a reference signal generation unit that supplies a reference signal to the input signal generation unit, the reference signal for use as a reference in an operation in which the input signal generation unit generates the input signal, to the input signal generation unit; and a detection unit that, while implementing a test of the semiconductor device, generates a standard signal in which the same signal output as an output of the reference signal output from the reference signal generation unit is expected, and outputs a detection unit output signal based on the reference signal and the standard signal, wherein the detection unit outputs the detection unit output signal in response to a result of comparing the reference signal and the standard signal with each other, wherein the test system further includes a control device that stops the test of the semiconductor device based on the detection unit output signal output from the detection unit, wherein the test system further includes a diagnosis item storage device that, regarding function diagnosis for diagnosing whether or not each function of the test system operates as specified, stores information in which whether or not to implement the function diagnosis is set for each of function diagnosis items, wherein the control device extracts the function diagnosis item for a function for use in the test of the semiconductor device as a function diagnosis target item subjected to the function diagnosis, wherein the control device refers to the information stored in the diagnosis item storage device, and implements the function diagnosis for only the function diagnosis target item, and wherein the control device extracts the function diagnosis target item while implementing the test of the semiconductor device.

8. A test system comprising:

an input signal generation unit that generates an input signal that drives a semiconductor device as a test target;

a reference signal generation unit that supplies a reference signal to the input signal generation unit, the reference signal for use as a reference in an operation in which the input signal generation unit generates the input signal, to the input signal generation unit; and a detection unit that, while implementing a test of the semiconductor device, generates a standard signal in which the same signal output as an output of the reference signal output from the reference signal generation unit is expected, and outputs a detection unit output signal based on the reference signal and the standard signal, wherein the detection unit outputs the detection unit output signal in response to a result of comparing the reference signal and the standard signal with each other, wherein the test system further includes a control device that stops the test of the semiconductor device based on the detection unit output signal output from the detection unit, wherein the test system further includes a diagnosis item storage device that, regarding function diagnosis for diagnosing whether or not each function of the test system operates as specified, stores information in which whether or not to implement the function diagnosis is set for each of function diagnosis items, wherein the control device extracts the function diagnosis item for a function for use in the test of the semiconductor device as a function diagnosis target item subjected to the function diagnosis, wherein the control device refers to the information stored in the diagnosis item storage device, and implements the function diagnosis for only the function diagnosis target item, and wherein the reference signal generation unit and the detection unit are supplied with a signal output from a common external standard.

* * * * *